(12) United States Patent
Mori et al.

(10) Patent No.: US 6,280,062 B1
(45) Date of Patent: Aug. 28, 2001

(54) LIGHT SOURCE DEVICE AND ILLUMINATION SYSTEM

(75) Inventors: Tetsuya Mori; Shinichi Shima, both of Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/358,456

(22) Filed: Jul. 22, 1999

Related U.S. Application Data (62) Division of application No. 08/725,657, filed on Oct. 1, 1996, now Pat. No. 5,971,577.

(30) Foreign Application Priority Data

Oct. 2, 1995 (JP) .................................................. 7-278365

(51) Int. Cl.$^7$ ........................................................ F21V 7/00
(52) U.S. Cl. ............................ 362/308; 362/296; 362/347
(58) Field of Search ................................. 362/296, 347, 362/350, 308

(56) References Cited

U.S. PATENT DOCUMENTS

| | | | |
|---|---|---|---|
| 3,669,524 | 6/1972 | Shio | 350/87 |
| 4,497,013 | 1/1985 | Ohta | 362/32 |
| 4,530,578 | 7/1985 | Kato | 350/526 |
| 4,682,885 | 7/1987 | Torigoe | 355/67 |
| 4,734,829 | 3/1988 | Wu et al. | 362/32 |
| 5,091,744 | 2/1992 | Omata | 355/53 |
| 5,153,773 | 10/1992 | Muraki et al. | 359/619 |
| 5,218,660 | 6/1993 | Omata | 385/116 |
| 5,263,250 | 11/1993 | Nishiwaki et al. | 29/890.1 |
| 5,268,744 | 12/1993 | Mori et al. | 356/400 |
| 5,305,054 | 4/1994 | Suzuki et al. | 355/53 |
| 5,309,197 | 5/1994 | Mori et al. | 355/53 |
| 5,379,090 | 1/1995 | Shiraishi | 355/67 |
| 5,440,463 | * 8/1995 | Ellion | 362/350 X |
| 5,471,371 | * 11/1995 | Koppolu et al. | 362/347 X |
| 5,486,919 | 1/1996 | Tsuji et al. | 356/349 |
| 5,498,878 | 3/1996 | Hasegawa et al. | 250/548 |
| 5,574,556 | 11/1996 | Mori et al. | 356/244 |
| 5,594,549 | 1/1997 | Mori et al. | 356/401 |
| 5,751,404 | 5/1998 | Murakami et al. | 355/53 |
| 5,847,974 | 12/1998 | Mori et al. | 364/571.02 |

FOREIGN PATENT DOCUMENTS

| | | |
|---|---|---|
| 62-2540 | 1/1987 | (JP) . |
| 62-115718 | 5/1987 | (JP) . |
| 62-115719 | 5/1987 | (JP) . |
| 1-198708 | 8/1989 | (JP) . |
| 1-198709 | 8/1989 | (JP) . |
| 5-45605 | 2/1993 | (JP) . |
| 62705101 | 9/1994 | (JP) . |

* cited by examiner

*Primary Examiner*—Stephen Husar
(74) *Attorney, Agent, or Firm*—Fitzpatrick, Cella, Harper & Scinto (57) ABSTRACT

A light source device includes a lamp for emitting light and a concave mirror for reflecting the light emitted from the lamp. The concave mirror has a reflection surface substantially rotationally symmetric with respect to an optical axis of the concave mirror. A shadow of the lamp is projected in a direction inclined with respect to the optical axis of the concave mirror.

7 Claims, 8 Drawing Sheets

LIGHT SOURCE DEVICE AND ILLUMINATION SYSTEM

This application is a divisional of Application Ser. No. 08/725,657, filed Oct. 1, 1996 now U.S. Pat. No. 5,971,577.

FIELD OF THE INVENTION AND RELATED ART

This invention relates to a light source device and/or an illumination system. More particularly, the invention is concerned with a light source device and/or an illumination system usable in an optical microscope, an exposure system or an alignment system of an exposure apparatus for the manufacture of microdevices such as semiconductor memories, CCDs, display devices or magnetic heads, for example.

As regards illumination methods used in an optical microscope, there are critical illumination wherein an image of a light source is placed at a position optically conjugate with an object, to be observed, with respect to an illumination optical system, or Koehler illumination wherein an image of a light source (or the light source itself) is placed at a pupil plane position of an illumination optical system. Practically, rather than the critical illumination which easily causes non-uniformness of illumination (because an image of a filament is formed on the object to be observed), Koehler illumination is used in many cases (because non-uniformness of the light source does not appear on the object).

Figure 8:
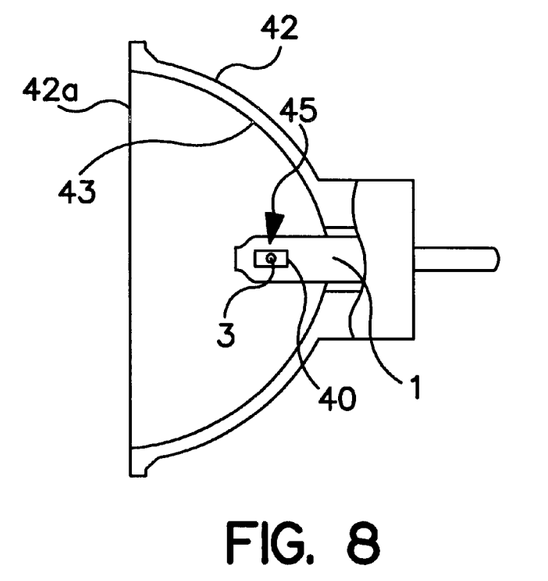
FIG. 8 is a schematic view of a known example of a halogen lamp unit.

In optical microscopes, in many cases, a halogen lamp unit which provides white light and which is easy to handle is used as an illumination light source. FIG. 8 shows an example of such a halogen lamp unit, wherein a lamp and a reflection mirror are formed into an integral structure.

Figure 7:
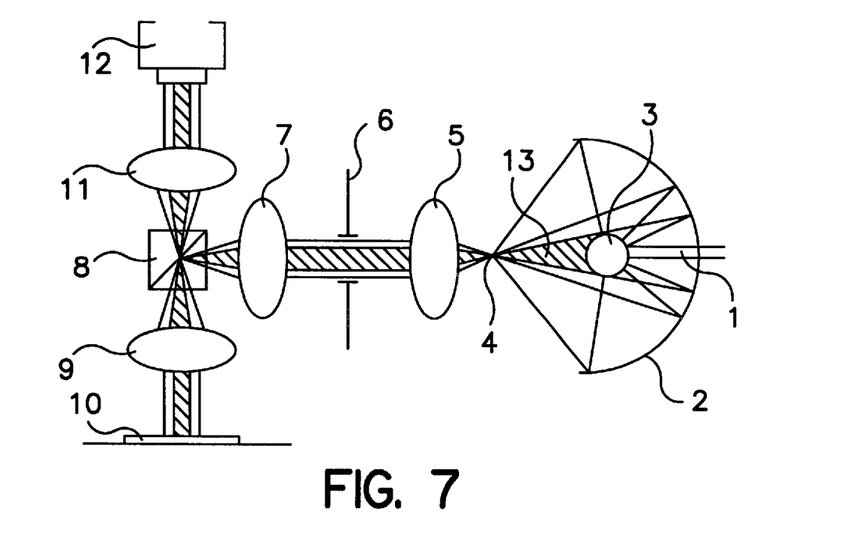
FIG. 7 is a schematic view of a known example of an optical microscope.

FIG. 7 is a schematic view of a general structure of a reflection type microscope, which is an example of an optical microscope using a halogen lamp unit as an illumination source. This halogen lamp unit is a light source device of the type in which a halogen electrode 3 providing a luminous point of the halogen lamp 1 is disposed at a first focal point position of an elliptical reflection mirror 2 such that an image of the halogen electrode 3 is formed at a second focal point position 4 of the reflection mirror 2. The light converged at that position 4 is directed by a lens 5 to a field stop 6, and, by this stop 6, it is shaped into light having a sectional shape and size necessary for illuminating an illumination region. Then, through refraction by a lens 7 and reflection by a half mirror 8, the light is refracted by a lens 9 and it illuminates an object 10 which is the subject to be observed. The light is reflected and diffracted (or scattered) by the object 10, and it is projected onto a CCD 12 via the lens 9, the half mirror 8 and a lens 11, whereby an enlarged image of the object 10 is formed on the CCD 12.

FIG. 8 illustrates the structure of a halogen lamp unit usable as an illumination source. Halogen lamp 1 has a filament 40 of a coiled structure which is formed as a unit with a mirror 42 of revolving cup-like shape. Formed at the inside face of the mirror 42 is a mirror reflection surface 43 of a rotational paraboloidal surface shape or an elliptical surface shape, for example. Luminous point 3 of the halogen lamp 1 is formed in coincidence with a focal point position 45 of the reflection surface 43, and the central axis passing the focal point coincides with the axis of the halogen lamp 1. Also, the optical axis of the halogen lamp unit is the optical axis (central axis) of the reflection surface 43.

Light emitted by the filament 40 of the halogen lamp 1 is reflected by the reflection surface 43, and it is projected through an illumination opening of the mirror 42. When the reflection surface 43 comprises an elliptical surface and the luminous point 3 of the halogen lamp 1 is disposed at the first focal point position of the elliptical surface 43, the light as reflected by the elliptical surface 43 is collected at a second focal point position of the elliptical surface 43.

In a halogen lamp unit of the type, as described above, in which a luminous point 44 of a halogen lamp 41 is imaged by a reflection surface 43 of an elliptical surface shape, there is a problem that, at the second focal point position where the light from the luminous point 3 is collected, the convergent light from the reflection surface 43 is blocked by the halogen electrode 3. As a result, shade light (low intensity component) is produced in the central portion of the light flux which is being converged. As illustrated in FIG. 7, the halogen electrode 3 blocks the reflection light from the reflection mirror 2, and this causes shade light 13 as depicted by hatching. In the case of Koehler illumination, this shade light 13 corresponds to light rays which illuminate a central portion of the observation region of the object 10. Thus, it results in a decrease of illuminance in the vicinity of the center of the observation region and causes insufficiency of the illumination light quantity or non-uniformness of illuminance.

Also, in the case of a paraboloidal surface mirror wherein reflection light from a reflector is parallel light, a similar problem arises.

SUMMARY OF THE INVENTION

It is an object of the present invention to provide a light source device and/or an illumination system which assures that no shadow of a light source is projected onto a surface to be illuminated or, even if a shadow is projected, the effect of it is suppressed sufficiently.

In accordance with an aspect of the present invention, there is provided a light source device, comprising: a light source; and a reflection mirror for reflecting light from said light source, wherein a shadow of said light source is projected in a direction inclined with respect to an optical axis of said reflection mirror.

In accordance with another aspect of the present invention, there is provided a light source device, comprising: a light source; and a concave mirror for reflecting light from said light source; wherein said light source is eccentric with respect to an optical axis of said concave mirror such that a shadow of said light source is projected in a direction inclined with respect to an optical axis of said concave mirror.

In accordance with a further aspect of the present invention, there is provided an illumination system, comprising: a light source device including a light source and a reflection mirror for reflecting light from said light source; and an optical system for illuminating a surface with light from said light source device; wherein a shadow of said light source is projected from said light source device in a direction inclined with respect to an optical axis of said optical system such that the shadow of said light source is not substantially projected on the surface through said optical system.

In accordance with a yet further aspect of the present invention, there is provided an illumination system for illuminating a surface, comprising: a light source device including a light source and a concave mirror for reflecting light from said light source; and an optical system for illuminating the surface with light from said light source device; wherein said light source device is arranged to project a shadow of said light source in a direction inclined with respect to an optical axis of said optical system such that the shadow of said light source is not substantially projected on the surface through said optical system.

A light source device or an illumination system according to the present invention is suitably usable in an optical microscope, or an exposure optical system or an alignment optical system in an exposure apparatus for the manufacture of microdevices such as semiconductor memories, CCDs, display devices or magnetic heads, for example.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
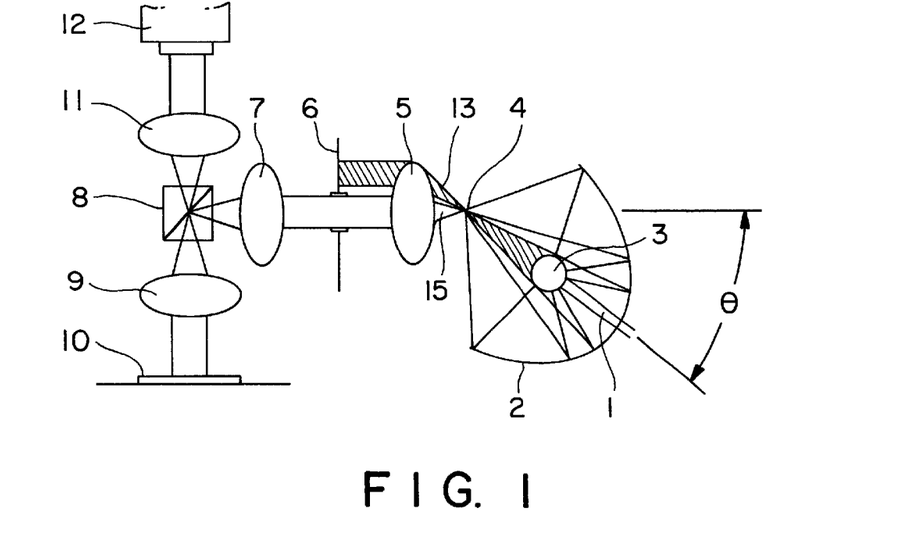
FIG. 1 is a schematic view of the structure of an optical microscope according to a first embodiment of the present invention.

FIG. 1 is a schematic view of an optical microscope according to a first embodiment of the present invention. The elements corresponding to those of the FIG. 7 example are denoted by like numerals. An important feature of the present embodiment is that a halogen lamp unit is rotationally tilted by an angle θ about a rotational center at a second focal point 4 (light convergence position) of an elliptical reflection mirror 2. The convergence position 4 may be considered as an input position of illumination light to an illumination optical system, following it. The convergence position 4 is located on an optical axis of the illumination optical system (5-7). Also, the angle θ is such an angle with which a shade light 13 of a halogen electrode 3 within the convergent light flux from the elliptical reflection mirror 2 is positioned outside a light flux 15, for illuminating an observation region upon an object 10 to be observed, such that it is eclipsed by a field stop 6.

Figure 2:
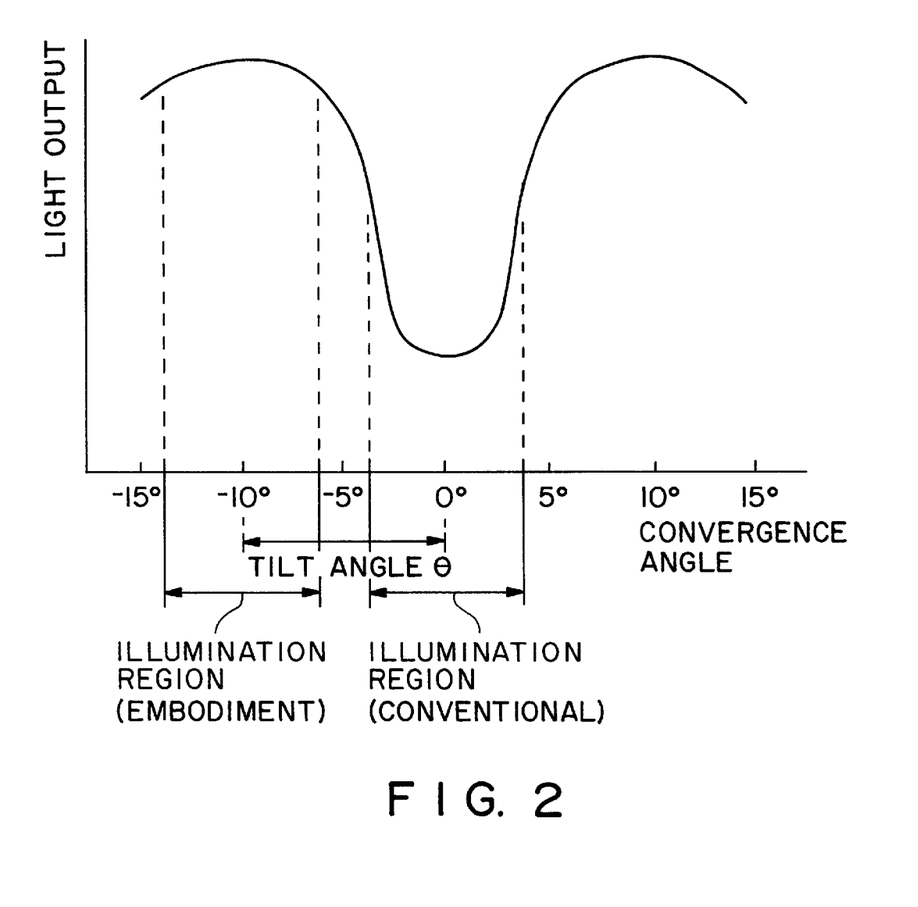
FIG. 2 is a graph for explaining a difference between the present invention and a prior art example with respect to a light intensity distribution with an angle, at a second focal point position.

FIG. 2 is a graph for explaining a light intensity distribution, with the angle, of convergent light at the convergence position 4. The reference for the angle in this graph is taken on the optical axis of the halogen lamp unit. It is seen in this graph that the light intensity is slowed down in a portion about an angle of zero deg. where the shade light 13 of the halogen electrode is influential. It is to be noted that, although in FIGS. 1 and 7, the shade light 13 of the halogen electrode 3 is depicted as being clearly separated from other regions not eclipsed, actually the intensity profile does not vary interruptedly but there is produced an uninterrupted light intensity profile such as depicted in FIG. 2. This applies to any other embodiment to be described later.

Conventionally, the optical axis of a halogen lamp unit is aligned with the optical axis of an illumination optical system and, as a result, light rays about an angle of zero deg. are mainly used for Koehler illumination. In this embodiment, as compared therewith, a high light-intensity region about an angle of −10 deg. shown in the graph of FIG. 2 is used for Koehler illumination. This enables illumination and observation of the object 10, to be observed, with higher illuminance. To this end, in this embodiment, the tilt angle of the optical axis of the halogen lamp unit with respect to the optical axis of the illumination optical system is set to about 10 deg., such that a brighter light portion from the halogen lamp unit is used for the illumination. Since the tilt angle of the optical axis of the halogen lamp unit is determined on the basis of the characteristic as depicted in FIG. 2, practically an angular distribution of light intensity may be predetected in accordance with the type of the halogen lamp unit to be used, and an optimum angle may then be determined. An adjusting member for adjusting the tilt angle of the halogen lamp unit may be provided, and an optimum angle may be determined by using it.

In FIG. 1, the halogen lamp unit is displaced downwardly. However, the direction is not important. Any direction is acceptable provided that the optical axis of the halogen lamp unit deviates by θ from the optical axis of the illumination optical system. Tilting the axis enables use of a high intensity portion of convergent light flux at the convergence position 4 and also makes it possible to utilize the performance of the halogen lamp unit sufficiently. As a result, the non-uniformness of illuminance within the illumination region upon the object 10 to be observed is improved.

Figure 3:
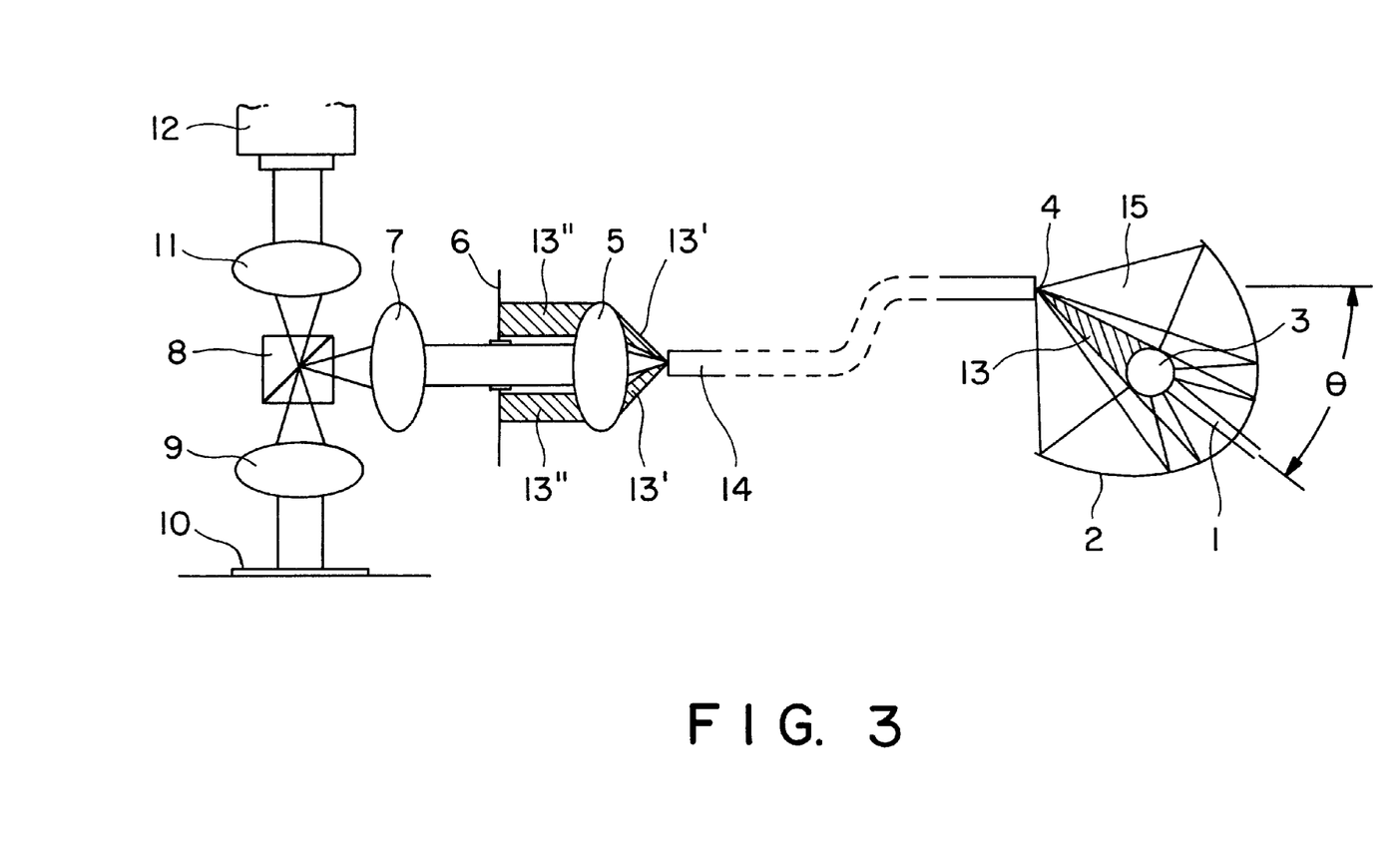
FIG. 3 is a schematic view of the structure of an optical microscope according to a second embodiment of the present invention.

FIG. 3 shows a second embodiment of the present invention, which is an example wherein light from a halogen lamp unit is directed to an illumination optical system by means of an optical fiber bundle 14. Since a light source portion is a heat source, if the system is used in a step-and-repeat exposure apparatus (stepper), for example, wherein strict temperature control is required, the light source portion and the other main portion of the optical microscope may preferably be disposed separately with an adequate distance maintained therebetween. Also in this embodiment, the halogen lamp unit is tilted, and this enables use of a light intensity portion of the light flux therefrom for illumination of an illumination region upon an object 10 to be observed. Higher uniformness of illuminance is assured.

In the FIG. 3 arrangement, a light entrance end of the optical fiber bundle 14 is disposed at a second focal point position 4 of the halogen lamp unit, and the other end (light exit end) of the fiber bundle is disposed at a pupil plane of an illumination optical system of the optical microscope. The optical fiber bundle has a characteristic that an input light is transmitted while preserving the angular characteristic of the input light and, for this reason, the halogen lamp unit and the optical fiber bundle 14 are disposed opposed to each other. More specifically, they are disposed so that a normal to the center of the light entrance end face of the optical fiber bundle 14 is aligned with the optical axis of the halogen lamp unit 1. This causes a shade light of the halogen electrode 3 provide light rays which illuminated a portion around the center of the observation region upon the object 10 to be illuminated. As a result, the illuminance in the portion around the center of the observation region decreases due to the effect of the shade light 13.

In consideration of this, in the FIG. 3 embodiment, the optical axis of the halogen lamp unit is disposed inclined by an angle θ with respect to a normal to the center on the light entrance end face of the optical fiber bundle 14. With this arrangement, the shade light 13 exits the light exit end of the fiber bundle 14, with inclination, such that within the illumination optical system there are produced expansions of light as depicted by hatchings 13' and 13". These shade lights 13' and 13" are then eclipsed by a field stop 6 having an opening corresponding to the observation region and, therefore, they do not illuminate the object 10. Thus, the light which illuminates the observation region is the light 15 of a high illuminance region shown in FIG. 3, not having been eclipsed by the halogen electrode 3. As a result, illumination and observation with higher illuminance and less non-uniformness are assured.

Also, like the first embodiment, what is important is the relative tilt θ between the optical axis of the halogen lamp unit and the end face of the optical fiber bundle. There is a latitude in the direction of tilt, provided that such a relative angular relation is maintained.

Figure 4:
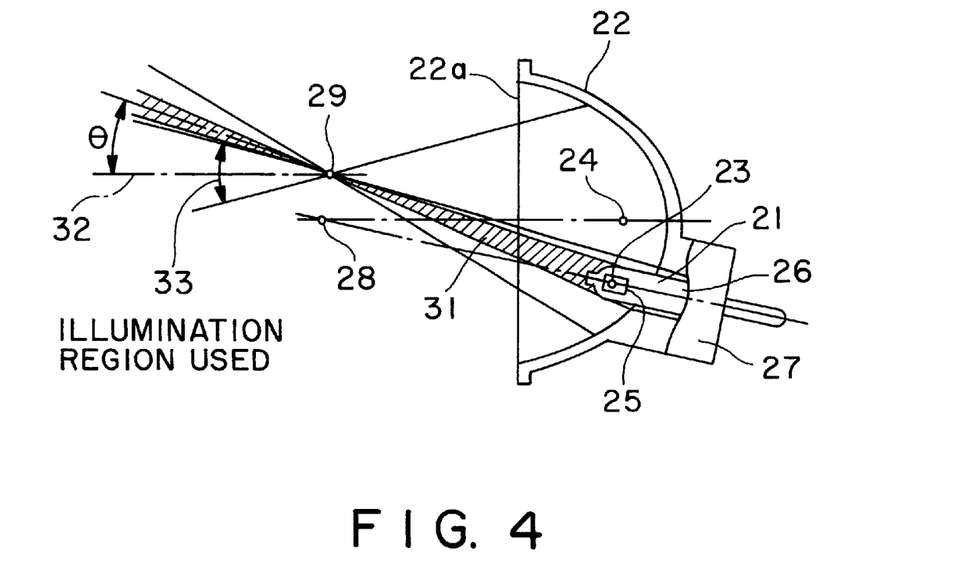
FIG. 4 is a schematic view of a halogen lamp unit according to a third embodiment of the present invention.

While the foregoing embodiments have been described with reference to examples wherein a commercially available halogen lamp unit is used and the effect of shade light is removed by the structure of an optical system, similar advantages are attainable by modifying the structure of the halogen lamp itself. FIG. 4 shows a third embodiment of the present invention, which is an example wherein the structure of a halogen lamp unit is modified. In the halogen lamp unit of this embodiment, a halogen lamp 21 (light source) is provided with a reflector which comprises an elliptical reflection mirror 22 mounted to the lamp into an integral structure. The arrangement is such that a luminous point 23 of the halogen lamp 21 is disposed at a position shifted from a first focal point position 24 of the elliptical reflection mirror 22.

The halogen lamp 21 is made of quartz or silica glass and, within this glass cylinder, an inertia gas and a small amount of halogenide are contained together with a filament 25 and sealed by means of a sealing 26. The filament 25 is of a longitudinal yoke type and it is wound into a coil around the axial center of the halogen lamp 21. The elliptical reflection mirror 22 has a projection opening 22a of approximately circular shape, formed at its forward end. Also, a neck 27 of approximately cylindrical shape is formed at the back of the reflector 22. The axis of the cylindrical portion of the neck 27 is disposed in alignment with the longitudinal direction of the halogen lamp 21, and the seal 26 of the halogen lamp 21 is fixed to this neck 27. The longitudinal direction of the halogen lamp 21 is set so as to be substantially in alignment with the direction connecting the second focal point position 28 of the elliptical reflector 22 and the luminous point of the halogen lamp 21.

In the system of FIG. 4, the luminous point 23 of the halogen lamp 21 is disposed at a position which is deviated from the first focal point position 24 of the elliptical reflection mirror 22, in a direction perpendicular to the optical axis of the elliptical reflection mirror 22. The light from the halogen lamp 21 is collected at a position 29 which is deviated, by an amount corresponding to the amount of that deviation, from the second focal point position 28 of the elliptical reflection mirror 22 in a direction perpendicular to the optical axis. Here, shade light 13 of the luminous point 23 of the halogen electrode is inclined by an angle θ with respect to the optical axis 32 of the illumination optical system, as depicted by hatching. Since the shade light 31 is not included in the illumination region (light), to be used, of the illumination optical system as denoted by a reference numeral 33, combined use of a lamp unit according to this embodiment and an illumination optical system accomplishes illumination of higher illuminance and less non-uniformness.

Figure 5:
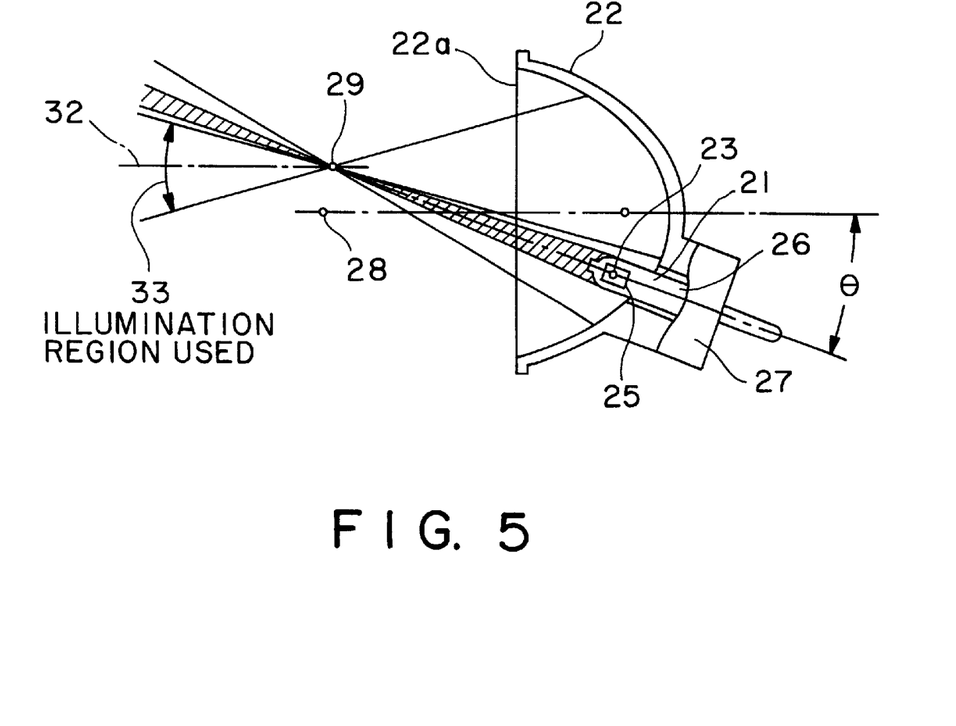
FIG. 5 is a schematic view of a halogen lamp unit according to a fourth embodiment of the present invention.

FIG. 5 shows a halogen lamp unit according to a fourth embodiment of the present invention. Like numerals as those of the third embodiments are assigned to corresponding elements. A distinction to the third embodiment resides in that the longitudinal direction of a halogen lamp 21 is placed substantially in alignment with the direction which connects the luminous point 23 of the halogen lamp and a convergent point 29 where the luminous point 23 is imaged by the elliptical reflection mirror 22. The structure of the remaining portion and the operation thereof are similar to those having been described with reference to FIG. 4. As depicted by hatching, shade light 31 is tilted by an angle θ with respect to the optical axis of the illumination optical system, and it is not included in the illumination region (light), to be used, of the illumination optical system as denoted by reference numeral 33. Thus, illumination of higher illuminance and less non-uniformness is achieved.

Figure 6:
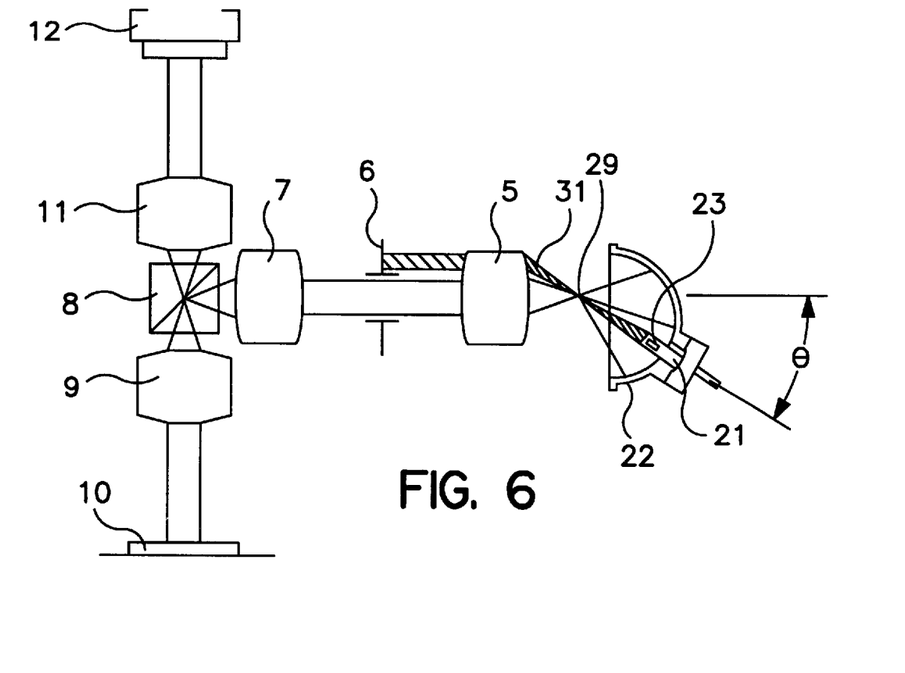
FIG. 6 is a schematic view of the structure wherein a halogen lamp unit according to a fifth embodiment of the present invention is incorporated into an optical microscope.

FIG. 6 shows an example wherein a halogen lamp unit according to the FIG. 4 or 5 embodiment is incorporated into an optical microscope. Also in this example, like numerals as those of the foregoing embodiments are assigned to corresponding elements. As has been described with reference to FIG. 4 or 5, the halogen lamp unit of this embodiment is arranged so that the luminous point 23 of the halogen lamp 21 is deviated from the first focal point position 24 of the elliptical reflector 22. The amount of deviation is so set that shade light 31 of a halogen electrode within the convergent light from the elliptical reflector 22 toward the second focal point 29 is eclipsed by a field stop 6, to assure that it is not included in the light used for the illumination.

Practical advantages of the halogen lamp unit of this embodiment may be explained similarly to the first embodiment. In the graph of FIG. 2, the angle of a conventional halogen lamp unit along the optical axis is zero, whereas, in the halogen lamp unit of this embodiment, this zero position corresponds to the tilt angle θ as described. Thus, the light to be projected to the illumination optical system and used as effective light is light in a region about −θ. In this embodiment, the shade light among output light from the halogen lamp unit is inclined by about an angle θ=10 deg. with respect to the optical axis of the illumination system. As a result, with an illumination optical system for an optical microscope for performing Koehler illumination, it is possible to use brighter light of about −θ=−10 deg. That is, with the use of the halogen lamp unit, it becomes possible to use a high light-intensity region for Koehler illumination. Illumination and observation of the object 10 with brighter illuminance is thus assured.

Since the tilt angle is determined in accordance with the characteristic as shown in FIG. 2, the angular light-intensity distribution may be determined in accordance with the type of a halogen lamp unit to be used, and an optimum angle may then be determined. Also, while in FIG. 6 the halogen lamp unit is displaced downwardly, the direction of displacement is not important and tilt may be in any direction. Further, an optical fiber bundle may be used in the FIG. 6 embodiment, like the FIG. 3 embodiment.

Tilting the shade light provides an additional advantage, in addition to usability of a higher intensity portion (light) of convergent light at the convergence point 29. Since, in Koehler illumination, the angular light-intensity distribution is reflected to the uniformness of illuminance upon the region being illuminated, the uniformness of illuminance in that region is enhanced such that it becomes possible to utilize the performance of the halogen lamp unit sufficiently.

Further, in the structure of FIG. 6, if the mount of the halogen lamp unit is modified like a conventional one, then by simply changing the halogen lamp unit of the FIG. 4 or 5 example by a conventional unit while keeping the optical axis of the halogen lamp unit in alignment with the optical axis of the illumination optical system, observation of an observation region upon the object with higher illuminance is accomplished.

The present invention is applicable not only to an illumination system using a halogen lamp unit but also to an illumination system which uses any other lamp unit. For such a lamp unit, there may be one that uses a light collecting mirror such as paraboloidal surface mirror, for example. Another example of a lamp unit may be one that uses a lamp comprising a xenon lamp, a high pressure Hg lamp or a metal haloide lamp, for example. Further, the fiber bundle 14 may be replaced by a single optical fiber of an appropriate diameter or a glass rod of a suitable diameter.

Figure 9:
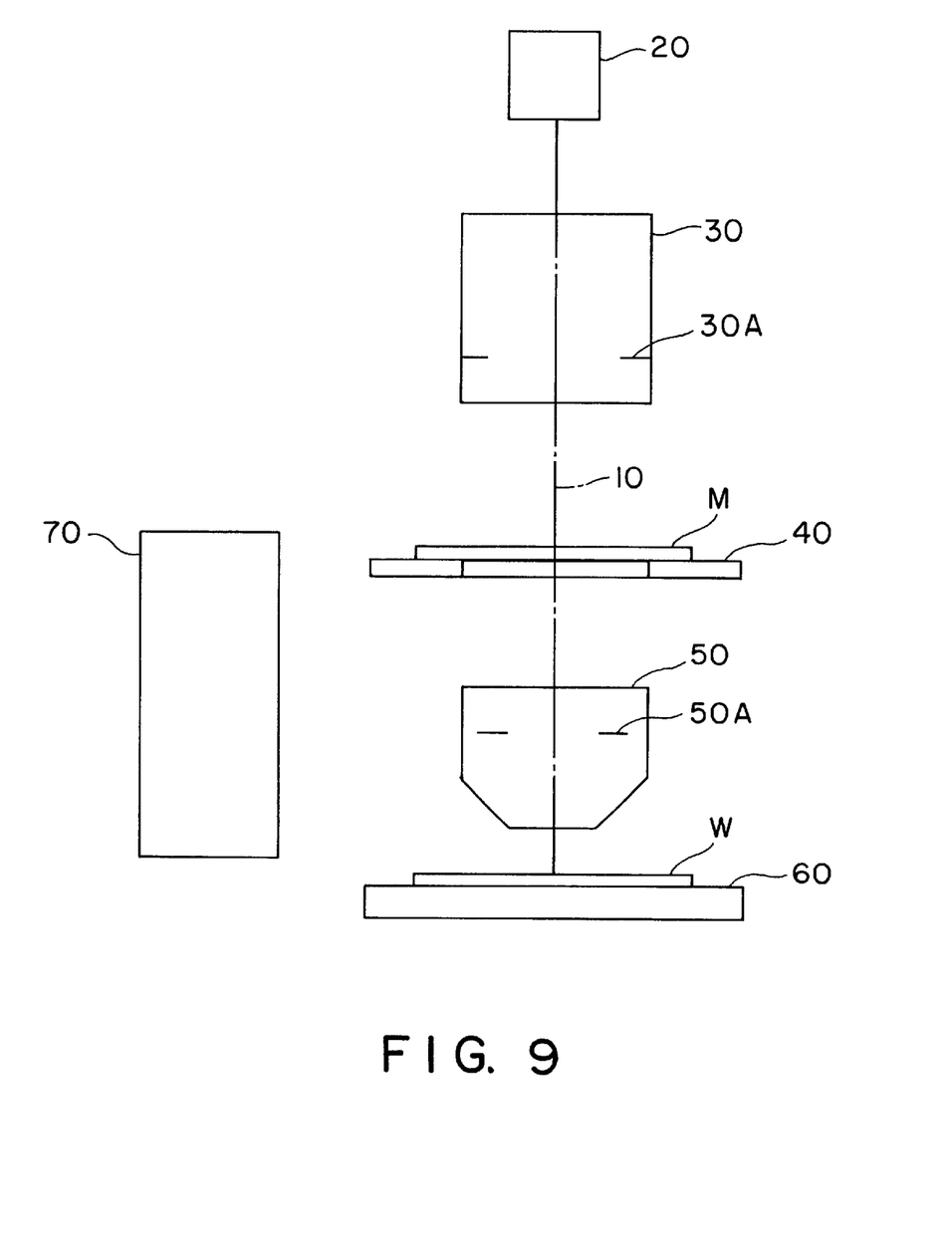
FIG. 9 is a schematic view of an exposure apparatus according to an embodiment of the present invention.

FIG. 9 shows a projection exposure apparatus for the manufacture of semiconductor devices.

Denoted in FIG. 9 at M is a reticle having a circuit pattern formed thereon. Denoted at W is a wafer which is coated with a resist. Denoted at 10 is an optical axis of the apparatus, and denoted at 20 is a light source (primary light source). Denoted at 30 is an illumination optical system for directing light from the light source 20 to the reticle M. Denoted at 30A is an aperture stop of the illumination optical system 30. The stop 30A is disposed in the vicinity of a light exit face of an optical integrator (fly's eye lens), not shown, of the illumination optical system 30, and it cooperates with the optical integrator to define a ring-like secondary light source at the opening thereof. Denoted at 40 is a reticle stage for holding the reticle M, and denoted at 50 is a projection lens system for projecting a reduced image of the circuit pattern of the reticle M, as it is illuminated uniformly with light from the ring-like secondary light source of the illumination optical system 30. Denoted at 50A is an aperture stop of the projection lens system 50, and it serves to define a pupil of the projection lens system 50. The following description will be made while taking the position of the opening of the stop 50A as a pupil position. Denoted at 60 is a wafer stage for holding the wafer W, and it serves to hold the wafer W so that the surface of the wafer W coincides with the imaging plane of the circuit pattern of the reticle M provided by the projection lens system 50. Denoted at 70 is an optical system for an alignment operation, and it comprises a microscope shown in FIGS. 1, 3 or 6 as a main component thereof.

With the structure described above and when the reticle M is illuminated by means of the light source 20 and the illumination optical system 30, diffraction light caused by the circuit pattern (which mainly comprises a combination of longitudinal and lateral patterns) of the reticle M is caught by the opening of the stop 50A of the projection lens system 50, and, by using this diffraction light, the projection lens system 50 projects an image of the circuit pattern of the reticle M onto the wafer W. By this, the circuit pattern image is transferred to the resist of the wafer W. Through such an exposure-transfer process, semiconductor chips are produced from the wafer W.

In the apparatus of FIG. 9, before projecting the image of the circuit pattern onto the wafer W, alignment marks formed on the wafer W are detected by using the optical system 70 and, on the basis of it, the position of the wafer W with respect to the lens system 50 is detected. Then, the position of the wafer W with respect to the lens system 50 (or reticle M) is adjusted.

Next, an embodiment of a microdevice manufacturing method according to the present invention, which uses an exposure apparatus such as described above, will be explained.

Figure 10:
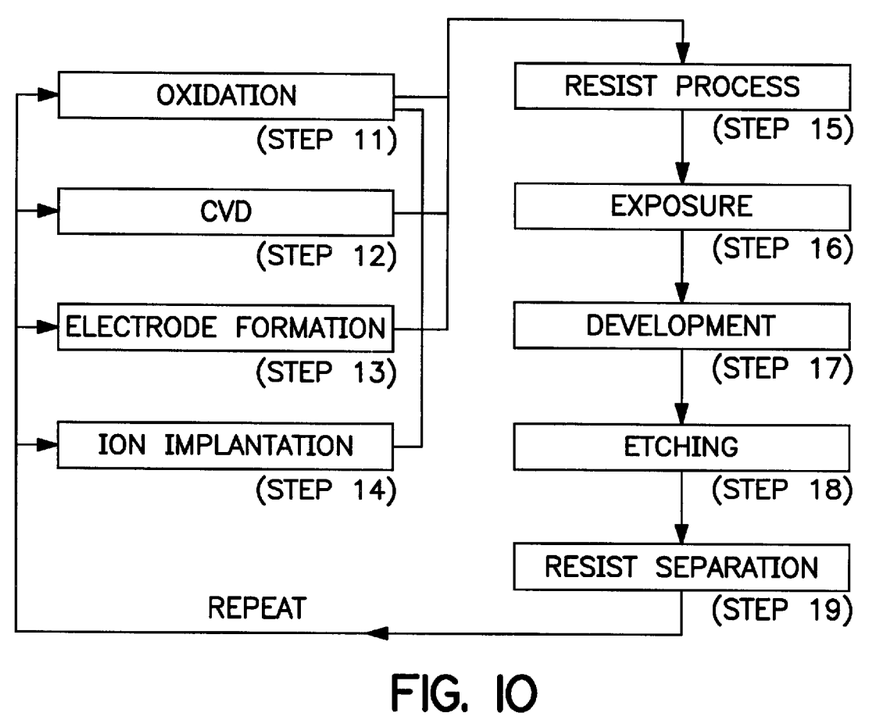
FIG. 10 is a flow chart of semiconductor device manufacturing processes.

FIG. 10 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 11:
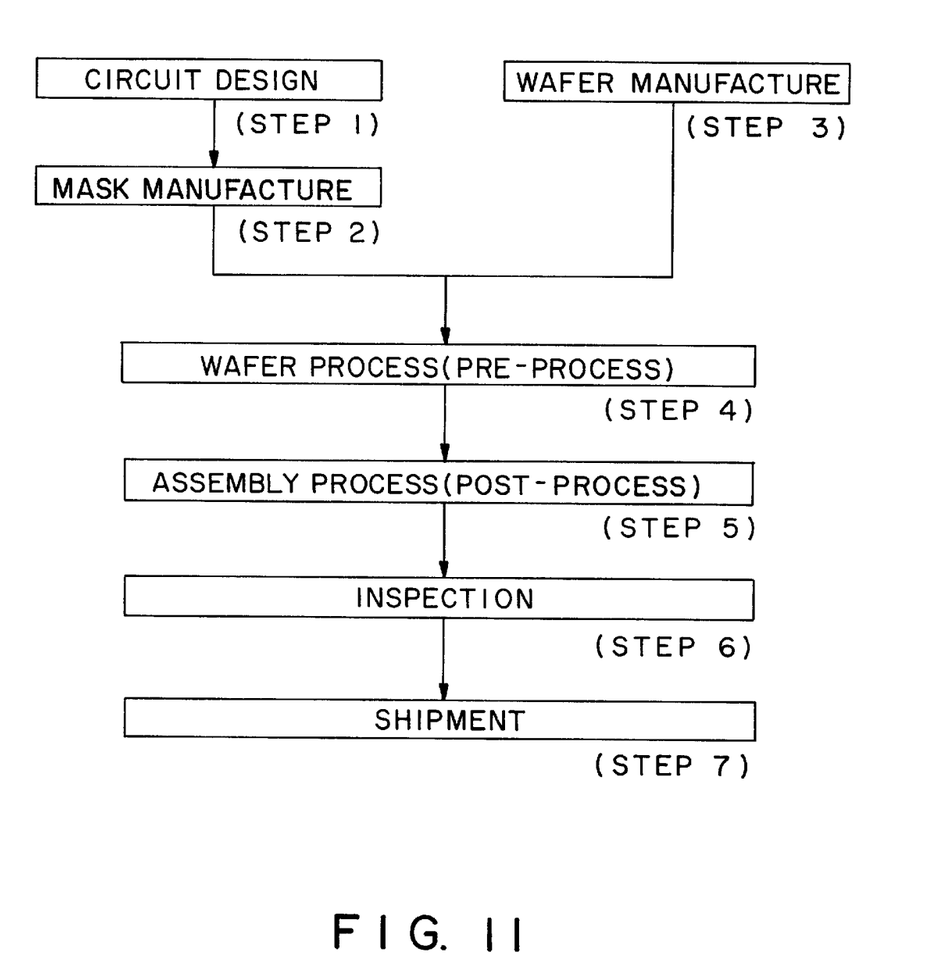
FIG. 11 is a flow chart of a wafer process included in the procedure of FIG. 10.

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A light source device, comprising:
   a lamp for emitting light; and a concave mirror for reflecting light from said lamp, said concave mirror having a reflection surface substantially rotationally symmetric with respect to an optical axis of said concave mirror, wherein said lamp is eccentric with respect to the optical axis of said concave mirror such that a shadow of said lamp is projected in a direction inclined with respect to the optical axis of said concave mirror.

2. A device according to claim 1, wherein said lamp is a halogen lamp.

3. A device according to claim 2, wherein said concave mirror is an elliptical surface mirror.

4. A device according to claim 2, wherein said concave mirror is a paraboloidal surface.

5. A device according to claim 1, wherein an axis of said lamp is inclined with respect to the optical axis of said concave mirror, in one of the direction of projection and a direction slightly deviated from the direction of projection.

6. An illumination optical system, comprising:

a light source device as recited in any one of claims 1–5; and a lens system for illuminating a surface to be illuminated, with light from said light source device.

7. An observation system, comprising:

an illumination optical system as recited in claim 6; and an observation optical system for observing an object to be observed, as illuminated by said illumination optical system.

* * * * *

UNITED STATES PATENT AND TRADEMARK OFFICE
CERTIFICATE OF CORRECTION

PATENT NO.   : 6,280,062 B1
DATED        : August 28, 2001
INVENTOR(S)  : Tetsuya Mori et al.

It is certified that error appears in the above-identified patent and that said Letters Patent is hereby corrected as shown below:

Title page,
Item [56], FOREIGN PATENT DOCUMENTS, the last Japanese patent document listed, "62705101  9/1994  (JP)." should read -- 6-275101  9/1994  (JP). --.

Column 1,
Line 60, " in coincidence" should read -- to coincide --.

Column 4,
Line 5, "deg." should read -- deg., --.

Column 5,
Line 5, "provide light rays which illuminated" should read -- to provide light rays which illuminate --.
Line 11, "inclined" should read -- to be inclined --.

Column 6,
Line 25, "having been" should be deleted.
Line 52, "region" should read -- region of --.
Line 67, "a" should be deleted.

Column 7,
Line 5, "like" should read -- as in --.
Line 17, "by" should read -- with --.
Line 29, "haloide" should read -- haloid --.

Signed and Sealed this

Eleventh Day of March, 2003

JAMES E. ROGAN
*Director of the United States Patent and Trademark Office*